United States Patent
Nishiyama et al.

(10) Patent No.: US 11,997,837 B2
(45) Date of Patent: May 28, 2024

(54) POWER SEMICONDUCTOR MODULE AND POWER CONVERTER

(71) Applicant: Mitsubishi Electric Corporation, Tokyo (JP)

(72) Inventors: Taketo Nishiyama, Tokyo (JP); Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 323 days.

(21) Appl. No.: 17/467,867

(22) Filed: Sep. 7, 2021

(65) Prior Publication Data
US 2022/0141988 A1 May 5, 2022

(30) Foreign Application Priority Data

Nov. 2, 2020 (JP) .................. 2020-183487

(51) Int. Cl.
| | |
|---|---|
| *H05K 7/20* | (2006.01) |
| *H02M 7/00* | (2006.01) |
| *H05K 1/02* | (2006.01) |
| *H02M 7/5387* | (2007.01) |
| *H02P 27/06* | (2006.01) |

(52) U.S. Cl.
CPC ............ *H05K 7/209* (2013.01); *H02M 7/003* (2013.01); *H05K 1/0204* (2013.01); *H05K 7/20454* (2013.01); *H02M 7/5387* (2013.01); *H02P 27/06* (2013.01); *H05K 2201/10166* (2013.01);
(Continued)

(58) Field of Classification Search
CPC ........ H05K 7/20; H05K 7/29; H05K 7/20454; H05K 7/2039; H05K 7/20463; H05K 7/20472; H05K 7/205; H05K 7/2089–209; H05K 1/0201–0212; H05K 1/021; H05K 2201/10166; H05K 2201/10174; H05K 2201/2018; H01L 21/4817; H01L 21/4882; H01L 21/52; H01L 21/56; H01L 23/13; H01L 23/28; H01L 23/31; H01L 23/34–3738; H01L 23/40–4093; H01L 23/49575; H01L 23/49568; H01L 2023/4068; H02M 7/003; H02M 7/5387; H02P 27/06
See application file for complete search history.

(56) References Cited

U.S. PATENT DOCUMENTS

| | | | |
|---|---|---|---|
| 9,711,430 B2 * | 7/2017 | Nishida | H01L 21/56 |
| 11,581,230 B2 * | 2/2023 | Ludwig | H01L 21/52 |

(Continued)

FOREIGN PATENT DOCUMENTS

| | | |
|---|---|---|
| JP | H11-330328 A | 11/1999 |
| WO | 2014/041936 A1 | 3/2014 |

*Primary Examiner* — Amir A Jalali
(74) *Attorney, Agent, or Firm* — Studebaker & Brackett PC

(57) ABSTRACT

The power semiconductor module includes a power semiconductor assembly and a heat transfer member. The power semiconductor assembly includes a circuit board and a case. The circuit board includes an insulating substrate. The second attachment surface to which the heat transfer member is attached is recessed from the first attachment surface to which the heat sink is attached. The maximum recessed distance of the second attachment surface from the first attachment surface is smaller than the original thickness of the heat transfer member, and is greater than the lower limit thickness of the heat transfer member.

16 Claims, 9 Drawing Sheets

(52) U.S. Cl.
CPC .............. *H05K 2201/10174* (2013.01); *H05K 2201/2018* (2013.01)

(56) References Cited

U.S. PATENT DOCUMENTS

| | | | | |
|---|---|---|---|---|
| 2010/0252922 | A1* | 10/2010 | Bayerer | H01L 25/072 156/60 |
| 2010/0302741 | A1* | 12/2010 | Kanschat | H01L 25/072 361/728 |
| 2013/0134572 | A1* | 5/2013 | Lenniger | H01L 23/367 438/122 |
| 2014/0374896 | A1* | 12/2014 | Nishida | H01L 23/4006 438/122 |
| 2015/0255367 | A1* | 9/2015 | Nakahara | H01L 23/4006 438/122 |
| 2015/0303126 | A1* | 10/2015 | Takahashi | H01L 23/49894 257/77 |
| 2016/0027709 | A1* | 1/2016 | Okamoto | H01L 23/49811 257/693 |
| 2021/0202330 | A1* | 7/2021 | Iizuka | H01L 23/3735 |
| 2021/0225731 | A1* | 7/2021 | Masumoto | H01L 23/562 |

* cited by examiner

POWER SEMICONDUCTOR MODULE AND POWER CONVERTER

BACKGROUND OF THE INVENTION

Field of the Invention

The present disclosure relates to a power semiconductor module and a power converter.

Description of the Background Art

Japanese Patent Laying-Open No. 11-330328 discloses a semiconductor module including a chip mounting substrate, an outer case, a semiconductor element composed of an IGBT chip, and a heat sink. The chip mounting substrate includes a ceramic substrate and a thin copper plate bonded to the ceramic substrate. The chip mounting board is closely bonded to the heat sink via thermally conductive grease. The outer case includes a side wall and a protruding portion protruding over the chip mounting substrate from an upper end of the side wall. The side wall of the outer case is attached to the heat sink. The protruding portion of the outer case contacts the peripheral edge of the chip mounting substrate.

SUMMARY OF THE INVENTION

However, in the power module disclosed in Japanese Patent Laying-Open No. 11-330328, when attaching the heat sink to the chip mounting substrate and the outer case, the ceramic substrate may be damaged. The present disclosure has been made in view of the abovementioned problem, and an object thereof is to provide a power semiconductor module and a power converter capable of preventing an insulating substrate from being damaged.

The power semiconductor module of the present disclosure includes a power semiconductor assembly and a heat transfer member. The power semiconductor assembly includes a circuit board, a power semiconductor device, and a case. The circuit board includes an insulating substrate having a first main surface, and a conductive circuit pattern provided on the first main surface of the insulating substrate. The power semiconductor device is mounted on the conductive circuit pattern. The case includes a hollow body and a protruding portion. The hollow body houses the power semiconductor device and the conductive circuit pattern. The protruding portion protrudes from the hollow body toward the inside of the hollow body, and directly or indirectly contacts the first main surface of the insulating substrate or the conductive circuit pattern. The power semiconductor assembly has a first attachment surface to which a heat sink is attached. The circuit board has a second attachment surface to which the heat transfer member is attached. The first attachment surface and the second attachment surface are located at a side distal from the power semiconductor device with respect to the insulating substrate. The second attachment surface is recessed from the first attachment surface in the stacking direction of the conductive circuit pattern and the insulating substrate. The maximum recessed distance of the second attachment surface from the first attachment surface is smaller than an original thickness of the heat transfer member when the heat transfer member is not pressed, and is greater than a lower limit thickness of the heat transfer member when the heat transfer member is pressed in the thickness direction of the heat transfer member.

The power converter of the present disclosure includes a main conversion circuit and a control circuit. The main conversion circuit includes the power semiconductor module of the present disclosure, and converts an input power and output the converted power. The control circuit outputs a control signal for controlling the main conversion circuit to the main conversion circuit.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
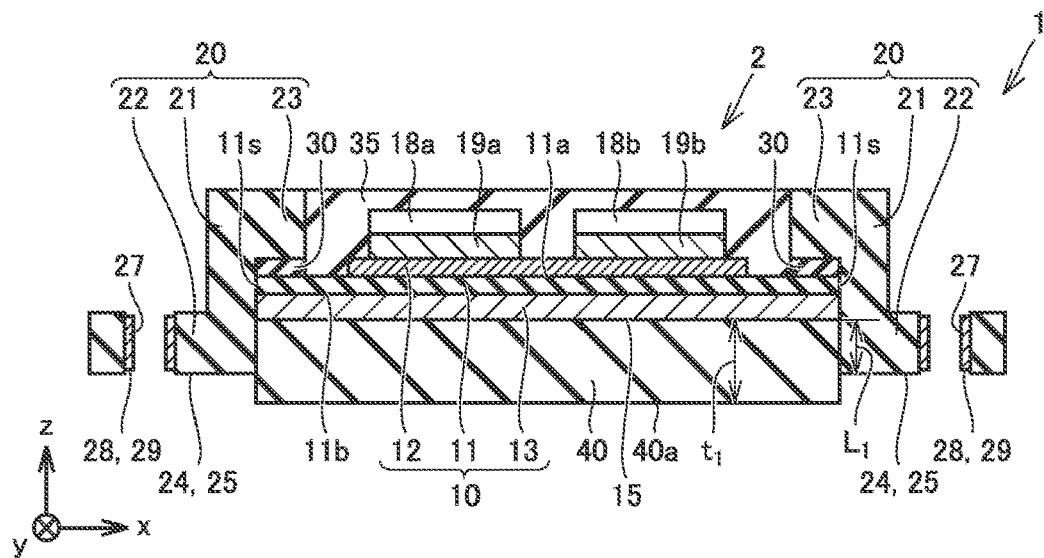
FIG. 1 is a schematic cross-sectional view of a power semiconductor module according to a first embodiment.

Hereinafter, embodiments of the present disclosure will be described. The same components are denoted by the same reference numerals, and the description thereof will not be repeated.

First Embodiment

Figure 2:
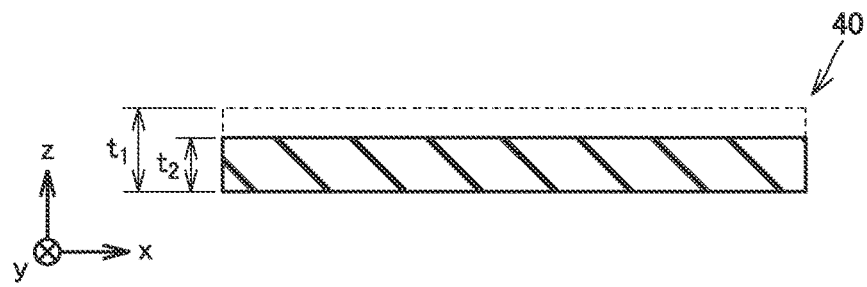
FIG. 2 is a schematic view of a heat transfer member.

A power semiconductor module 1 according to a first embodiment will be described with reference to FIGS. 1 and 2. The power semiconductor module 1 includes a power semiconductor assembly 2 and a heat transfer member 40.

The power semiconductor assembly 2 mainly includes a circuit board 10, power semiconductor devices 18a and 18b, and a case 20. The power semiconductor assembly 2 may further include a sealing member 35. The power semiconductor assembly 2 may further include a bushing 27.

The circuit board 10 includes an insulating substrate 11 and a conductive circuit pattern 12. The circuit board 10 may further include a conductive plate 13.

The insulating substrate 11 includes a first main surface 11a, a second main surface 11b opposite to the first main surface 11a, and a side surface 11s connecting the first main surface 11a and the second main surface 11b. Each of the first main surface 11a and the second main surface 11b extends in a first direction (x direction) and a second direction (y direction) perpendicular to the first direction. The first main surface 11a and the second main surface 11b are spaced from each other in a third direction (z direction) perpendicular to both the first direction (x direction) and the second direction (y direction). The side surface his extends in the second direction (y direction) and the third direction (z direction). The insulating substrate 11 is, for example, a ceramic substrate. Specifically, the insulating substrate 11 is made of an inorganic ceramic material such as alumina ($Al_2O_3$), aluminum nitride (AlN), silicon nitride ($Si_3N_4$), silicon dioxide ($SiO_2$) or boron nitride (BN).

The conductive circuit pattern 12 is provided on the first main surface 11a of the insulating substrate 11. The insulating substrate 11 and the conductive circuit pattern 12 are stacked in the third direction (z direction). The conductive plate 13 is provided on the second main surface 11b of the insulating substrate 11. The insulating substrate 11 and the conductive plate 13 are stacked in the third direction (z direction). The conductive circuit pattern 12 and the conductive plate 13 are made of a conductive metal material such as copper (Cu) or aluminum (Al).

The power semiconductor devices 18a and 18b are mounted on the conductive circuit pattern 12. Specifically, the power semiconductor devices 18a and 18b are bonded to the conductive circuit pattern 12 by using conductive bonding members 19a and 19b such as solder or a sintered body of metal fine particles. Each of the power semiconductor devices 18a and 18b is not particularly limited, and may be an insulated gate bipolar transistor (IGBT), a metal oxide semiconductor field effect transistor (MOSFET), or a diode. Each of the power semiconductor devices 18a and 18b is mainly made of, for example, silicon (Si) or a wide bandgap semiconductor material such as silicon carbide (SiC), gallium nitride (GaN), or diamond.

The case 20 houses the power semiconductor devices 18a and 18b and the conductive circuit pattern 12. The case 20 may further house the insulating substrate 11. The side surface 11s of the insulating substrate 11 may contact the case 20. The case 20 may further house the conductive plate 13. The case 20 is made of, for example, an insulating resin such as polyphenylene sulfide (PPS) resin, polyethylene terephthalate (PET) resin, epoxy resin, polyimide resin, or acrylic resin.

Specifically, the case 20 includes a hollow body 21, a flange 22, and a protruding portion 23. The hollow body 21 houses the power semiconductor devices 18a and 18b and the conductive circuit pattern 12. The hollow body 21 may further house the conductive plate 13. The hollow body 21 may further house at least a part of the heat transfer member 40.

The flange 22 is connected to one end of the hollow body 21 proximal to the heat transfer member 40. The flange 22 extends from one end of the hollow body 21 toward the outside of the hollow body 21. The power semiconductor assembly 2 is provided with a hole 29 which reaches a first attachment surface 25 and into which a fastening member 52 (see FIG. 3) such as a screw or a bolt is inserted. At least a part of the hole 29 is provided in the case 20. Specifically, the case 20 (the flange 22) is provided with a through hole 28. In the present embodiment, the hole 29 is identical to the through hole 28.

Figure 3:
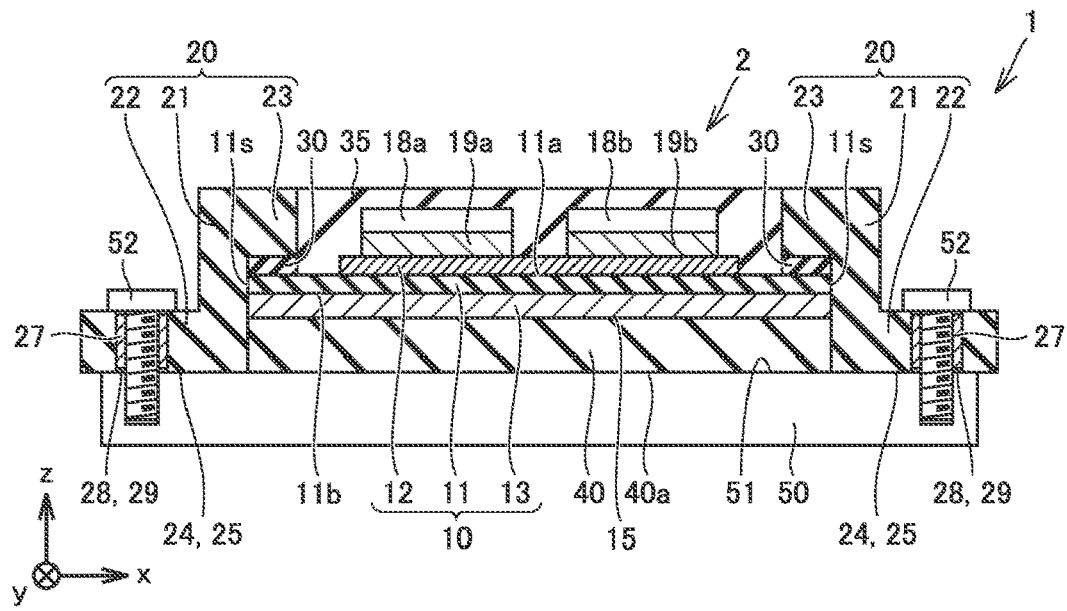
FIG. 3 is a schematic cross-sectional view of a power semiconductor module according to a modification of the first embodiment.

The power semiconductor assembly 2 includes a first attachment surface 25 to which a heat sink 50 (see FIG. 3) is attached using a fastening member 52 (see FIG. 3). The first attachment surface 25 is located on an opposite side to the power semiconductor devices 18a and 18b with respect to the insulating substrate 11. Specifically, the case 20 (the flange 22) includes a back surface 24 distal from the insulating substrate 11 in the stacking direction (the third direction, i.e., the z direction) of the conductive circuit pattern 12 and the insulating substrate 11. In the present embodiment, the back surface 24 of the case 20 (the flange 22) is flush with the first attachment surface 25.

The protruding portion 23 is connected to the other end of the hollow body 21 proximal to the power semiconductor devices 18a and 18b. The protruding portion 23 protrudes from the other end of the hollow body 21 toward the inside of the hollow body 21. The protruding portion 23 is opposite to the first main surface 11a of the insulating substrate 11 or the conductive circuit pattern 12 in a plan view of the first main surface 11a.

The protruding portion 23 directly or indirectly contacts the first main surface 11a of the insulating substrate 11 or the conductive circuit pattern 12. In the present specification, the description that the protruding portion 23 indirectly contacts the first main surface 11a of the insulating substrate 11 or the conductive circuit pattern 12 means that a member (for example, an adhesive 30) in contact with the protruding portion 23 and the first main surface 11a of the insulating substrate 11 or the conductive circuit pattern 12 is interposed between the protruding portion 23 and the first main surface 11a of the insulating substrate 11 or the conductive circuit pattern 12. For example, the protruding portion 23 indirectly contacts the first main surface 11a of the insulating substrate 11 via the adhesive 30. The protruding portion 23 is fixed to the circuit board 10 (such as the insulating substrate 11) using the adhesive 30 such as an insulating adhesive.

The bushing 27 may be disposed in the through hole 28 of the case 20 (the flange 22). The bushing 27 is hollow inside. The bush 27 is made of, for example, a metal material such as brass. A fastening member 52 (see FIG. 3) such as a screw or a bolt is inserted into the bushing 27. The bushing 27 allows the heat sink 50 (see FIG. 3) to be more strongly fastened to the case 20 (flange 22) by using the fastening member 52.

The sealing member 35 is provided in an inner space of the case 20 (the hollow body 21). The sealing member 35 seals the power semiconductor devices 18a and 18b. The sealing member 35 may further seal the conductive circuit pattern 12. The sealing member 35 is made of, for example, an insulating resin such as silicone resin, epoxy resin, urethane resin, polyimide resin, polyamide resin, or acrylic resin.

The heat transfer member 40 transfers heat generated by the power semiconductor devices 18a and 18b to the heat sink 50 (FIG. 3) at a lower thermal resistance. The thermal conductivity of the heat transfer member 40 is, for example, 1.0 W/(m·K) or more. The thermal conductivity of the heat transfer member 40 may be 3.0 W/(m·K) or more, 5.0 W/(m·K) or more, or 10.0 W/(m·K) or more.

The heat transfer member 40 is, for example, a thermal interface material (TIM). The TIM may be a non-fluid member, such as a sheet or gel, or a fluid member, such as grease. The heat transfer member 40 may be, for example, a graphite sheet or a thermally conductive sheet including a resin such as epoxy resin or silicone resin and a thermally conductive filler (such as silica filler, alumina filler, or aluminum nitride filler) dispersed in the resin. The heat transfer member 40 may be electrically insulating or electrically conductive.

The heat transfer member 40 is deformable under pressing. With reference to FIG. 2, the heat transfer member 40 has an original thickness $t_1$ which is the thickness of the heat transfer member 40 when the heat transfer member 40 is not pressed. The heat transfer member 40 has a lower limit thickness $t_2$ which is the minimum thickness of the heat transfer member 40 when the heat transfer member 40 is pressed in the thickness direction (the third direction, i.e., the z direction) of the heat transfer member 40. For example, when the heat transfer member 40 includes a filler, the lower limit thickness $t_2$ of the heat transfer member 40 is defined by the diameter of the filler. When the heat transfer member 40 is free of filler, the lower limit thickness $t_2$ of the heat transfer member 40 is defined by the difference between the original thickness $t_1$ of the heat transfer member 40 and the thickness obtained by multiplying the original thickness $t_1$ of the heat transfer member 40 by an allowable compression ratio of the heat transfer member 40. The allowable compression ratio of the heat transfer member 40 is defined as the ratio of the reduced thickness of the heat transfer member 40 under the application of a pressing force of 0.1 MPa in the thickness direction of the heat transfer member 40 to the original thickness $t_1$ of the heat transfer member 40.

The circuit board 10 has a second attachment surface 15 to which the heat transfer member 40 is attached. The second attachment surface 15 is located on an opposite side to the power semiconductor devices 18a and 18b with respect to the insulating substrate 11. Specifically, the conductive plate 13 includes a second attachment surface 15. The second attachment surface 15 is flush with the back surface of the conductive plate 13 distal from the insulating substrate 11. In the present embodiment, the second attachment surface 15 is a flat surface.

The second attachment surface 15 is recessed from the first attachment surface 25 toward the insulating substrate 11 in the stacking direction (the third direction, i.e., the z direction) of the conductive circuit pattern 12 and the insulating substrate 11. A maximum recessed distance $L_1$ of the second attachment surface 15 from the first attachment surface 25 is smaller than the original thickness $t_1$ of the heat transfer member 40 when the heat transfer member 40 is not pressed. In other words, when the heat transfer member 40 is not pressed, a surface 40a of the heat transfer member 40 distal from the insulating substrate 11 protrudes from the first attachment surface 25 in the stacking direction (the third direction, i.e., the z direction) of the conductive circuit pattern 12 and the insulating substrate 11. The maximum recessed distance $L_1$ of the second attachment surface 15 from the first attachment surface 25 is greater than the lower limit thickness $t_2$ of the heat transfer member 40 when the heat transfer member 40 is pressed in the thickness direction of the heat transfer member 40. In the present embodiment, since the first attachment surface 25 and the second attachment surface 15 are both flat surfaces, the maximum recessed distance $L_1$ of the second attachment surface 15 from the first attachment surface 25 is defined by the recessed distance of the second attachment surface 15 from the first attachment surface 25.

With reference to FIG. 3, the power semiconductor module 1 may further include a heat sink 50. The heat sink 50 has a main surface 51 proximal to the insulating substrate 11. The heat sink 50 dissipates heat generated by the power semiconductor devices 18a and 18b to the outside of the power semiconductor module 1. The heat sink 50 is made of, for example, a metal material such as aluminum. The heat sink 50 is attached to the first attachment surface 25. Specifically, the heat sink 50 is attached to the first attachment surface 25 using the fastening member 52 such as a screw or a bolt. In the present embodiment, the heat sink 50 is fastened to the case 20 (the flange 22) using the fastening member 52. The fastening member 52 is inserted into the bushing 27.

When attaching the heat sink 50 to the first attachment surface 25, the heat sink 50 contacts the heat transfer member 40, and thereby the heat transfer member 40 is pressed by the heat sink 50. Specifically, the main surface 51 of the heat sink 50 is brought into contact with the surface 40a of the heat transfer member 40. Thus, the heat transfer member 40 is compressed, and thereby the thickness of the heat transfer member 40 is reduced. The maximum recessed distance $L_1$ of the second attachment surface 15 from the first attachment surface 25 is smaller than the original thickness $t_1$ of the heat transfer member 40 when the heat transfer member 40 is not pressed, and is greater than the lower limit thickness $t_2$ of the heat transfer member 40 when the heat transfer member 40 is pressed in the thickness direction of the heat transfer member 40. Therefore, the thickness of at least a part of the heat transfer member 40 is not reduced to the lower limit thickness $t_2$ of the heat transfer member 40. Specifically, the entire thickness of the heat transfer member 40 is not reduced to the lower limit thickness $t_2$ of the heat transfer member 40. Therefore, an excessive stress is prevented from being applied from the heat transfer member 40 to the insulating substrate 11 (specifically, a region of the insulating substrate 11 located closer to the protruding portion 23, the fastening member 52 and the hole 29 (the through hole 28), in other words, a region of the insulating substrate 11 located closer to the side surface 11s).

The heat sink 50 may be brought into contact with the first attachment surface 25. Specifically, the main surface 51 of the heat sink 50 may be brought into contact with the back surface 24 of the case 20 (the flange 22).

A first example method of manufacturing the power semiconductor module 1 of the present embodiment will be described with reference to FIGS. 1 and 4. In the first example method, the heat transfer member 40 is a non-fluid member, such as a sheet or gel.

Figure 4:
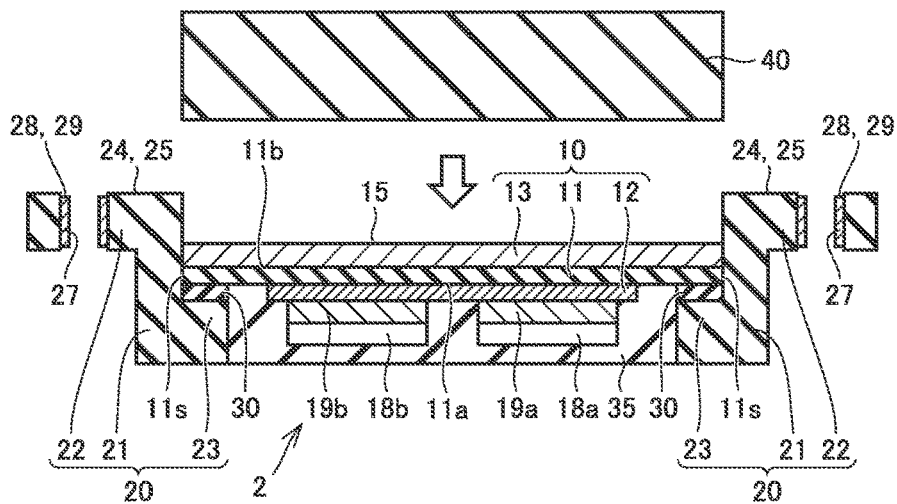
FIG. 4 is a schematic cross-sectional view illustrating a step of a first example method of manufacturing the power semiconductor module according to the first embodiment.

With reference to FIG. 4, a power semiconductor assembly 2 is prepared. Specifically, a circuit board 10 is prepared. The circuit board 10 includes an insulating substrate 11 and a conductive circuit pattern 12. The circuit board 10 may further include a conductive plate 13. The power semiconductor devices 18a and 18b are bonded to the conductive circuit pattern 12 using the conductive bonding members 19a and 19b. The case 20 is bonded to the circuit board 10 using the adhesive 30. The power semiconductor devices 18a and 18b are sealed using the sealing member 35. Thus, the power semiconductor assembly 2 is obtained. The power semiconductor assembly 2 has a first attachment surface 25. Specifically, the first attachment surface 25 is flush with the back surface 24 of the case 20 (the flange 22). The circuit board 10 has a second attachment surface 15. Specifically, the second attachment surface 15 is flush with the back surface of the conductive plate 13 distal from the insulating substrate 11.

With reference to FIG. 4, the heat transfer member 40 is attached to the second attachment surface 15 of the circuit board 10. For example, the heat transfer member 40 may be embedded into a recess formed by the case 20 and the second attachment surface 15. The heat transfer member 40 may be bonded to the second attachment surface 15 using, for example, a thermally conductive adhesive. Thereby, the power semiconductor module 1 as illustrated in FIG. 1 is obtained.

Further, with reference to FIG. 3, the heat sink 50 may be attached to the first attachment surface 25 of the power semiconductor assembly 2 using the fastening member 52 such as a screw or a bolt. The fastening member 52 is inserted into the hole 29. In the present embodiment, the hole 29 is identical to the through hole 28. When attaching the heat sink 50 to the first attachment surface 25, the heat sink 50 contacts the heat transfer member 40, and thereby the heat transfer member 40 is pressed by the heat sink 50. Specifically, the main surface 51 of the heat sink 50 is brought into contact with the surface 40a of the heat transfer member 40. Thus, the heat transfer member 40 is compressed, and thereby the thickness of the heat transfer member 40 is reduced. Thereby, the power semiconductor module 1 as illustrated in FIG. 3 is obtained.

A second example method of manufacturing the power semiconductor module 1 of the present embodiment will be described with reference to FIGS. 1, 5 and 6. In the second example method, the heat transfer member 40 is a fluid member, such as grease.

Figure 5:
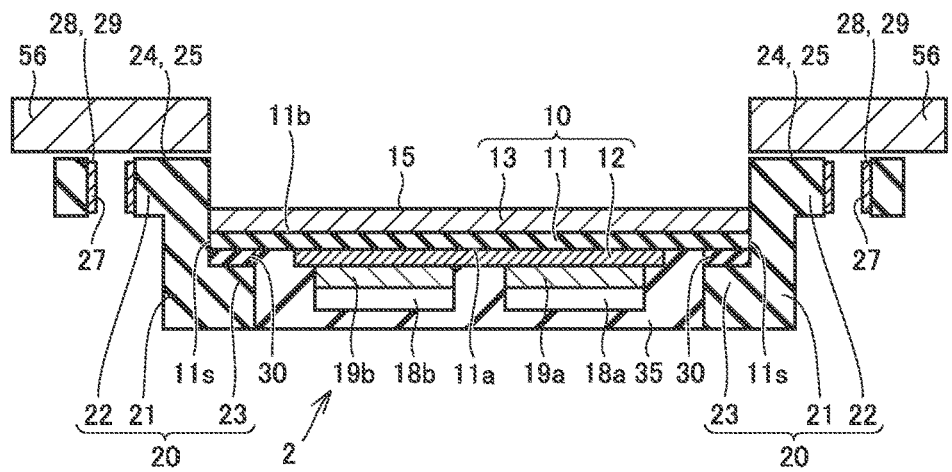
FIG. 5 is a schematic cross-sectional view illustrating a step of a second example method of manufacturing the power semiconductor module according to the first embodiment.

With reference to FIG. 5, similar to the first example method of manufacturing the power semiconductor module 1 of the present embodiment, a power semiconductor assembly 2 is prepared. Then, a mask 56 is placed on the first attachment surface 25 of the power semiconductor assembly 2.

Figure 6:
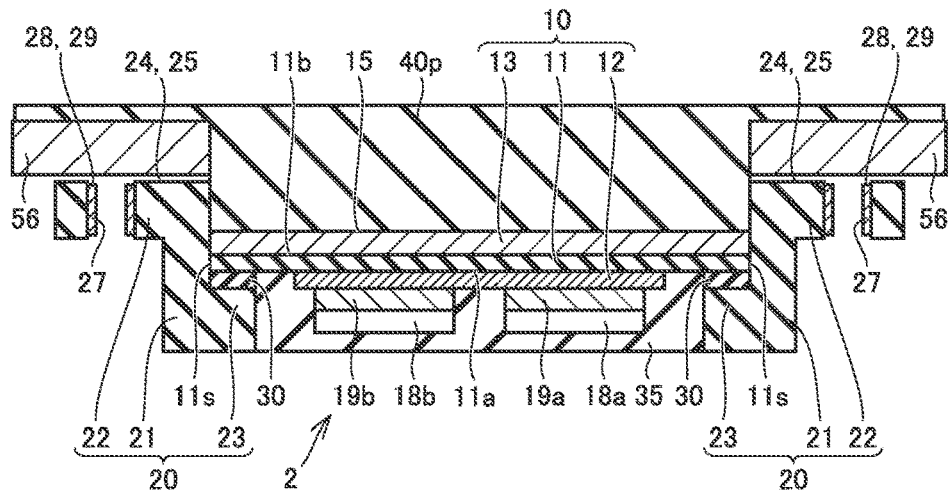
FIG. 6 is a schematic cross-sectional view illustrating a step subsequent to the step illustrated in FIG. 5 of the second example method of manufacturing the power semiconductor module according to the first embodiment.

With reference to FIG. 6, a material 40p having fluidity, such as grease, is applied on the second attachment surface 15 of the circuit board 10. The mask 56 prevents the material 40p having fluidity from adhering to the first attachment surface 25. Thereafter, the mask 56 is removed. Thereby, the power semiconductor module 1 as illustrated in FIG. 1 is obtained.

Further, with reference to FIG. 3, the heat sink 50 may be attached to the first attachment surface 25 of the power semiconductor assembly 2 using the fastening member 52 such as a screw or a bolt. Thereby, the power semiconductor module 1 as illustrated in FIG. 3 is obtained.

Effects of the power semiconductor module 1 of the present embodiment will be described.

The power semiconductor module 1 of the present embodiment includes a power semiconductor assembly 2 and a heat transfer member 40. The power semiconductor assembly 2 includes a circuit board 10, power semiconductor devices 18a and 18b, and a case 20. The circuit board 10 includes an insulating substrate 11 having a first main surface 11a, and a conductive circuit pattern 12 provided on the first main surface 11a of the insulating substrate 11. The power semiconductor devices 18a and 18b are mounted on the conductive circuit pattern 12. The case 20 includes a hollow body 21 and a protruding portion 23 protruding from the hollow body 21 toward the inside of the hollow body 21. The hollow body 21 houses the power semiconductor devices 18a and 18b and the conductive circuit pattern 12. The protruding portion 23 is opposite to the first main surface 11a or the conductive circuit pattern 12 in a plan view of the first main surface 11a of the insulating substrate 11, and directly or indirectly contacts the first main surface 11a or the conductive circuit pattern 12 of the insulating substrate 11. The power semiconductor assembly 2 includes a first attachment surface 25 to which the heat sink 50 is attached. The circuit board 10 includes a second attachment surface 15 to which the heat transfer member 40 is attached. The first attachment surface 25 and the second attachment surface 15 are located on an opposite side to the power semiconductor devices 18a and 18b with respect to the insulating substrate 11. The second attachment surface 15 is recessed from the first attachment surface 25 in the stacking direction (the third direction, i.e., the z direction) of the conductive circuit pattern 12 and the insulating substrate 11. The maximum recessed distance $L_1$ of the second attachment surface 15 from the first attachment surface 25 is smaller than the original thickness $t_1$ of the heat transfer member 40 when the heat transfer member 40 is not pressed, and is greater than the lower limit thickness $t_2$ of the heat transfer member 40 when the heat transfer member 40 is pressed in the thickness direction of the heat transfer member 40.

Therefore, even if the heat transfer member 40 is compressed when attaching the heat sink 50 to the first attachment surface 25, an excessive stress is prevented from being applied from the heat transfer member 40 to the insulating substrate 11 (especially, a region of the insulating substrate 11 located closer to the protruding portion 23), which makes it possible to prevent the insulating substrate 11 from being damaged. When attaching the heat sink 50 to the first attachment surface 25, the heat transfer member 40 is compressed. The heat transfer member 40 is strongly and closely bonded to the heat sink 50 and the first attachment surface 25. Thus, the heat generated by the power semiconductor devices 18a and 18b may be transferred to the heat sink 50 at a lower thermal resistance. Therefore, it is possible to improve the heat dissipation of the power semiconductor module 1.

In the power semiconductor module 1 of the present embodiment, the insulating substrate 11 further includes a second main surface 11b opposite to the first main surface 11a, and a side surface 11s connecting the first main surface 11a and the second main surface 11b. The circuit board 10 further includes a conductive plate 13 provided on the second main surface 11b of the insulating substrate 11. The case 20 has a first attachment surface 25. The conductive plate 13 has a second attachment surface 15.

Therefore, even if the heat transfer member 40 is compressed when attaching the heat sink 50 to the first attachment surface 25, an excessive stress is prevented from being applied from the heat transfer member 40 to the insulating substrate 11 (especially, a region of the insulating substrate 11 located closer to the protruding portion 23, in other words, a region of the insulating substrate 11 located closer to the side surface 11s is formed), which makes it possible to prevent the insulating substrate 11 from being damaged.

In the power semiconductor module 1 of the present embodiment, the power semiconductor assembly 2 includes a first attachment surface 25 to which the heat sink 50 is attached using the fastening member 52. The power semiconductor assembly 2 is provided with a hole 29 which reaches the first attachment surface 25 and into which the fastening member 52 is inserted. At least a part of the hole 29 is provided in the case 20.

Therefore, even if the heat transfer member 40 is compressed when attaching the heat sink 50 to the first attachment surface 25, an excessive stress is prevented from being applied from the heat transfer member 40 to the insulating substrate 11 (especially, a region of the insulating substrate 11 located closer to the protruding portion 23, the fastening member 52 and the hole 29), which makes it possible to prevent the insulating substrate 11 from being damaged.

The power semiconductor module 1 of the present embodiment further includes a heat sink 50. The heat sink 50 is attached to the first attachment surface 25, and is brought into contact with the heat transfer member 40.

Therefore, even if the heat transfer member 40 is compressed when attaching the heat sink 50 to the first attachment surface 25, an excessive stress is prevented from being applied from the heat transfer member 40 to the insulating substrate 11, which makes it possible to prevent the insulating substrate 11 from being damaged. Therefore, it is possible to improve the heat dissipation of the power semiconductor module 1.

In the power semiconductor module 1 of the present embodiment, the heat sink 50 is brought into contact with the first attachment surface 25. Therefore, it is possible to improve the heat dissipation of the power semiconductor module 1.

Second Embodiment

A power semiconductor module 1b and a power semiconductor assembly 2b according to a second embodiment will be described with reference to FIG. 7. The power semiconductor module 1b and the power semiconductor assembly 2b of the present embodiment mainly have the same configuration as the power semiconductor module 1 and the power semiconductor assembly 2 of the first embodiment, but are different from the power semiconductor module 1 and the power semiconductor assembly 2 of the first embodiment in the following points.

In the power semiconductor module 1b and the power semiconductor assembly 2b, the second attachment surface 15 bulges toward a distal side from the insulating substrate 11 in the stacking direction (third direction, i.e., the z direction) of the conductive circuit pattern 12 and the insulating substrate 11. The maximum recessed distance $L_1$ of the second attachment surface 15 from the first attachment surface 25 is defined by the recessed distance at which the edge of the second attachment surface 15 connected to the side surface 11s of the insulating substrate 11 is recessed from the first attachment surface 25. The maximum recessed distance $L_1$ is smaller than the original thickness $t_1$ of the heat transfer member 40 when the heat transfer member 40 is not pressed, and is greater than the lower limit thickness $t_2$ of the heat transfer member 40 when the heat transfer member 40 is pressed in the thickness direction of the heat transfer member 40. A top portion 13t of the second attachment surface 15 is away from the protruding portion 23, the fastening member 52 and the hole 29 (the through hole 28) farther than the side surface 11s of the insulating substrate 11 in a plan view of the first attachment surface 25. Specifically, the top portion 13t of the second attachment surface 15 is located at the center of the second attachment surface 15.

Figure 8:
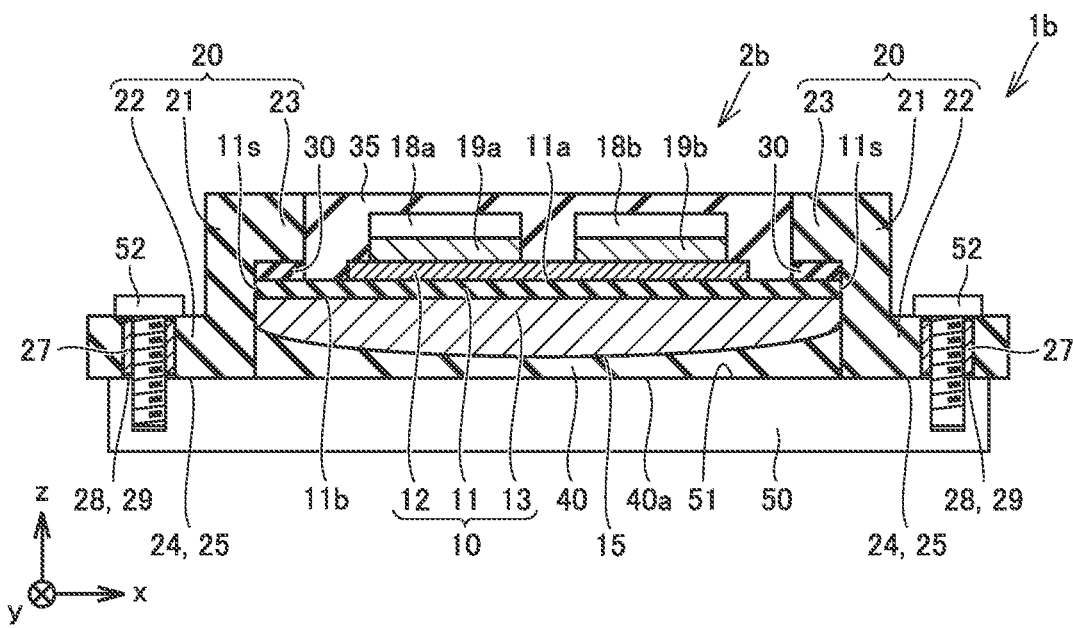
FIG. 8 is a schematic cross-sectional view of a power semiconductor module according to a modification of the second embodiment.

With reference to FIG. 8, the power semiconductor module 1b of the present embodiment may further include a heat sink 50. The heat sink 50 is attached to the first attachment surface 25, and is brought into contact with the heat transfer member 40.

Figure 7:
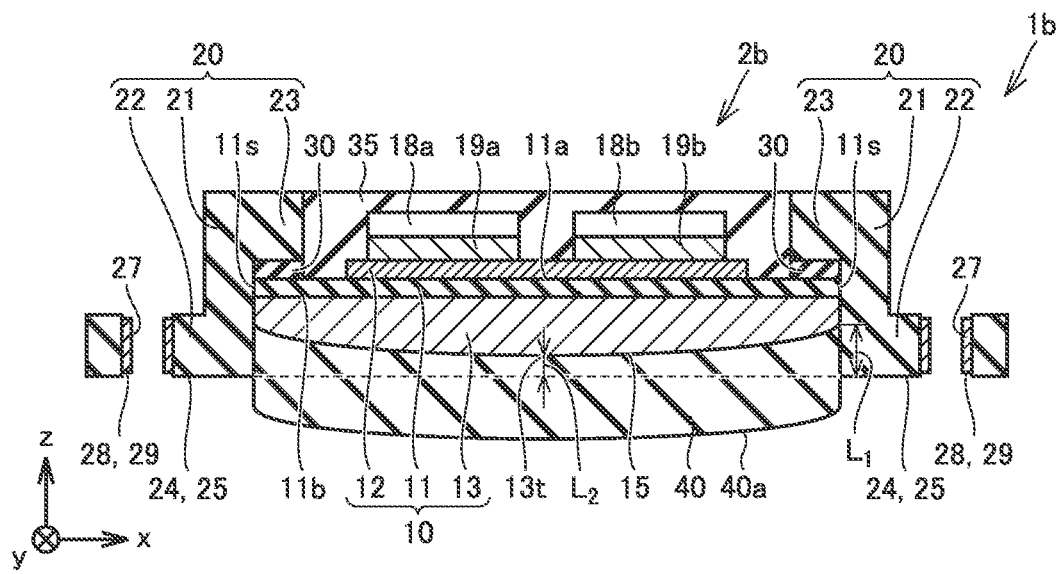
FIG. 7 is a schematic cross-sectional view of a power semiconductor module according to a second embodiment.

With reference to FIG. 7, the top portion 13t of the second attachment surface 15 is recessed from the first attachment surface 25 of the case 20 in the stacking direction (the third direction, i.e., the z direction) of the conductive circuit pattern 12 and the insulating substrate 11. A recessed distance $L_2$ of the top portion 13t of the second attachment surface 15 from the first attachment surface 25 may be greater than the lower limit thickness $t_2$ of the heat transfer member 40 when the heat transfer member 40 is pressed. Therefore, an excessive stress is prevented from being applied from the heat transfer member 40 to the insulating substrate 11 (especially, a region of the insulating substrate 11 located closer to the protruding portion 23, the fastening member 52 and the hole 29 (the through hole 28), in other words, a region of the insulating substrate 11 located closer to the side surface 11s).

The recessed distance $L_2$ of the top portion 13t of the second attachment surface 15 from the first attachment surface 25 may be smaller than the lower limit thickness $t_2$ of the heat transfer member 40 when the heat transfer member 40 is pressed. Even if the recessed distance $L_2$ is smaller than the lower limit thickness $t_2$ of the heat transfer member 40, since the maximum recessed distance $L_1$ is greater than the lower limit thickness $t_2$ of the heat transfer member 40, an excessive stress is prevented from being applied from the heat transfer member 40 to the insulating substrate 11 (especially, a region of the insulating substrate 11 located closer to the protruding portion 23, the fastening member 52 and the hole 29 (the through hole 28), in other words, a region of the insulating substrate 11 located closer to the side surface 11s).

In addition to the effects of the power semiconductor module 1 of the first embodiment, the power semiconductor module 1b of the present embodiment has the following effects.

In the power semiconductor module 1b of the present embodiment, the second attachment surface 15 bulges toward a distal side from the insulating substrate 11 in the stacking direction (the third direction, i.e., the z direction) of the conductive circuit pattern 12 and the insulating substrate 11. The top portion 13t of the second attachment surface 15 is away from the protruding portion 23 farther than the side surface 11s of the insulating substrate 11 in the plan view of the first attachment surface 25, and is recessed from the first attachment surface 25 in the stacking direction (the third direction, i.e., the z direction) of the conductive circuit pattern 12 and the insulating substrate 11.

Thus, the distance between the second attachment surface 15 and the heat sink 50 is reduced, which makes it possible to improve the heat dissipation of the power semiconductor module 1b.

In the power semiconductor module 1b of the present embodiment, the recessed distance $L_2$ of the top portion 13t of the second attachment surface 15 from the first attachment surface 25 is smaller than the lower limit thickness $t_2$ of the heat transfer member 40 when the heat transfer member 40 is pressed.

Even if the recessed distance $L_2$ is smaller than the lower limit thickness $t_2$ of the heat transfer member 40, since the maximum recessed distance $L_1$ is greater than the lower limit thickness $t_2$ of the heat transfer member 40, an excessive stress is prevented from being applied from the heat transfer member 40 to the insulating substrate 11 (especially, a region of the insulating substrate 11 located closer to the protruding portion 23, in other words, a region of the insulating substrate 11 located closer to the side surface 11s), which makes it possible to prevent the insulating substrate 11 from being damaged.

Third Embodiment

Figure 9:
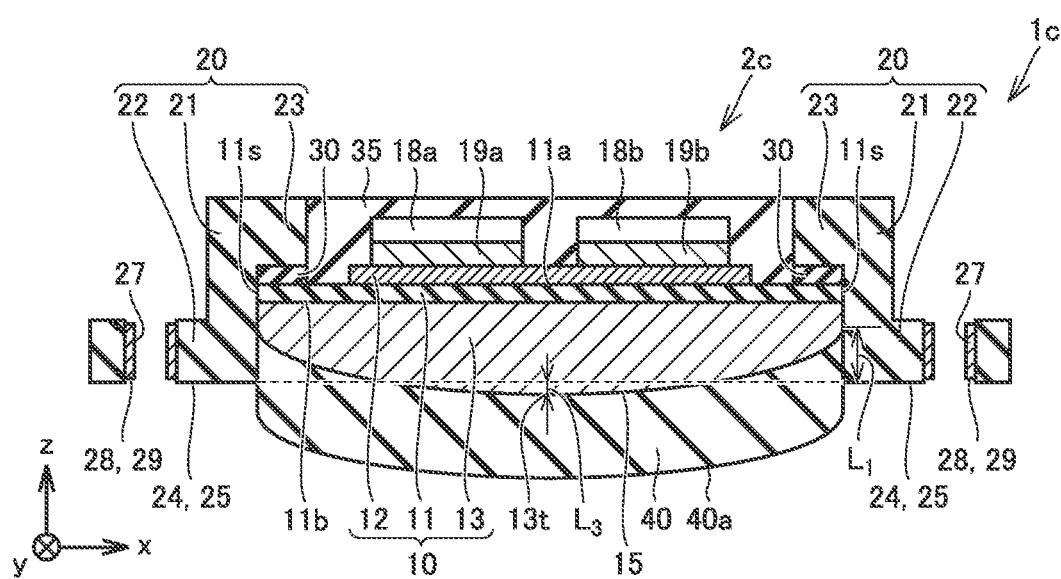
FIG. 9 is a schematic cross-sectional view of a power semiconductor module according to a third embodiment.

A power semiconductor module 1c and a power semiconductor assembly 2c according to a third embodiment will be described with reference to FIG. 9. The power semiconductor module 1c and the power semiconductor assembly 2c of the present embodiment mainly have the same configuration as the power semiconductor module 1b and the power semiconductor assembly 2b of the second embodiment, but are different from the power semiconductor module 1b and the power semiconductor assembly 2b of the second embodiment in the following points.

In the power semiconductor module 1c and the power semiconductor assembly 2c, the top portion 13t of the second attachment surface 15 protrudes from the first attachment surface 25 of the case 20 in the stacking direction (the third direction, i.e., the z direction) of the conductive circuit pattern 12 and the insulating substrate 11. A protruding height $L_3$ of the top portion 13t of the second attachment surface 15 from the first attachment surface 25 is equal to or less than the difference between the original thickness $t_1$ of the heat transfer member 40 and the sum of the maximum recessed distance $L_1$ and the lower limit thickness $t_2$. In other words, the protruding height $L_3$ of the top portion 13t of the second attachment surface 15 from the first attachment surface 25 satisfies the following expression (1):

$$L_3 \leq t_1 - (L_1 + t_2) \qquad (1).$$

Similar to the power semiconductor module 1b (see FIG. 8) of the second embodiment, the power semiconductor module 1c may further include a heat sink 50. The heat sink 50 is attached to the first attachment surface 25, and is brought into contact with the heat transfer member 40.

In addition to the effects of the power semiconductor module 1b of the second embodiment, the power semiconductor module 1c of the present embodiment has the following effects.

In the power semiconductor module 1c of the present embodiment, the second attachment surface 15 bulges toward the opposite side to the insulating substrate 11 in the stacking direction (the third direction, i.e., the z direction) of the conductive circuit pattern 12 and the insulating substrate 11. The top portion 13t of the second attachment surface 15 is away from the protruding portion 23 farther than the side surface 11s of the insulating substrate 11 in the plan view of the first attachment surface 25, and protrudes from the first attachment surface 25 in the stacking direction (the third direction, i.e., the z direction) of the conductive circuit pattern 12 and the insulating substrate 11. The protruding height $L_3$ of the top portion 13t of the second attachment surface 15 from the first attachment surface 25 is equal to or less than the difference between the original thickness $t_1$ of the heat transfer member 40 and the sum of the maximum recessed distance $L_1$ and the lower limit thickness $t_2$.

Thus, the distance between the second attachment surface 15 and the heat sink 50 is reduced, which makes it possible to further improve the heat dissipation of the power semiconductor module 1c. Even if the top portion 13t of the second attachment surface 15 protrudes from the first attachment surface 25 of the case 20 in the stacking direction (the third direction, i.e., the z direction) of the conductive circuit pattern 12 and the insulating substrate 11, since the protruding height $L_3$ of the top portion 13t of the second attachment surface 15 from the first attachment surface 25 is equal to or less than the difference between the original thickness $t_1$ of the heat transfer member 40 and the sum of the maximum recessed distance $L_1$ and the lower limit thickness $t_2$, an excessive stress is prevented from being applied from the heat transfer member 40 to the insulating substrate 11 (especially, a region of the insulating substrate 11 located closer to the protruding portion 23, in other words, a region of the insulating substrate 11 located closer to the side surface 11s), which makes it possible to prevent the insulating substrate 11 from being damaged.

Fourth Embodiment

Figure 10:
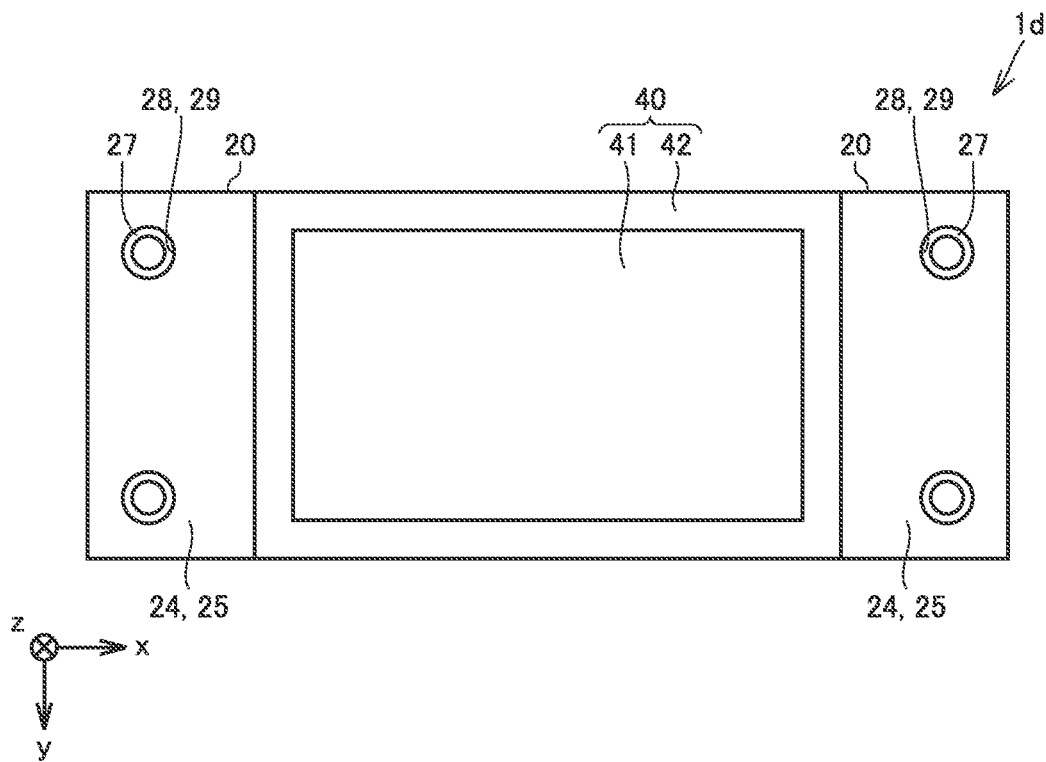
FIG. 10 is a schematic bottom view of a power semiconductor module according to a fourth embodiment.
Figure 11:
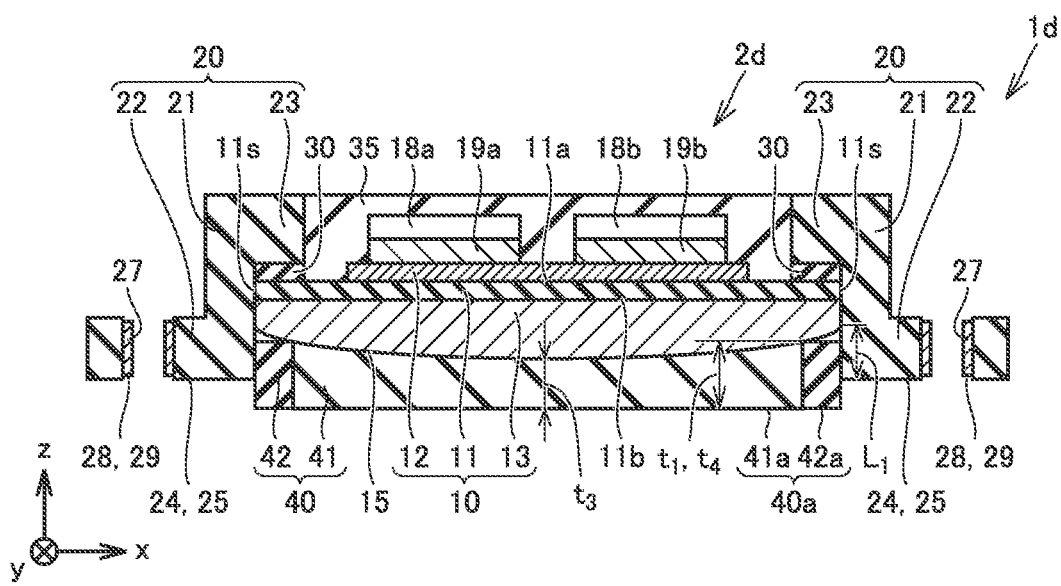
FIG. 11 is a schematic cross-sectional view of a power semiconductor module according to a fourth embodiment.

A power semiconductor module 1d and a power semiconductor assembly 2d according to a fourth embodiment will be described with reference to FIGS. 10 and 11. The power semiconductor module 1d and the power semiconductor assembly 2d of the present embodiment mainly have the same configuration as the power semiconductor module 1b and the power semiconductor assembly 2b of the second embodiment, but are different from the power semiconductor module 1b and the power semiconductor assembly 2b of the second embodiment in the following points.

In the power semiconductor module 1d and the power semiconductor assembly 2d, the heat transfer member 40 includes a first heat transfer layer 41 having fluidity and a second heat transfer layer 42 having non-fluidity. The first heat transfer layer 41 has a surface 41a distal from the insulating substrate 11. The second heat transfer layer 42 has a surface 42a distal from the insulating substrate 11. The surface 40a of the heat transfer member 40 includes the surface 41a of the first heat transfer layer 41 and the surface 42a of the second heat transfer layer 42. When the heat transfer member 40 is not pressed, the surface 41a of the first heat transfer layer 41 and the surface 42a of the second heat transfer layer 42 protrude from the first attachment surface 25 in the stacking direction (the third direction, i.e., the z direction) of the conductive circuit pattern 12 and the insulating substrate 11. In a plan view of the second attachment surface 15, the second heat transfer layer 42 surrounds the first heat transfer layer 41. The second heat transfer layer 42 is a heat transfer frame and functions as a dam for the first heat transfer layer 41.

A first minimum thickness $t_3$ of the first heat transfer layer 41 is greater than a lower limit thickness of the first heat transfer layer 41 when the first heat transfer layer 41 is pressed in the thickness direction (the third direction, i.e., the z direction) of the first heat transfer layer 41. The lower limit thickness of the first heat transfer layer 41 is defined in the same manner as the lower limit thickness of the heat transfer member 40.

In the present embodiment, the second heat transfer layer 42 has a constant thickness $t_4$, and a second minimum thickness of the second heat transfer layer 42 and a second maximum thickness of the second heat transfer layer 42 are both equal to the thickness $L_1$ of the second heat transfer layer 42. In the present embodiment, the thickness $L_1$ of the second heat transfer layer 42 defines the original thickness $t_1$ of the heat transfer member 40. The second minimum thickness of the second heat transfer layer 42 is greater than the lower limit thickness of the second heat transfer layer 42 when the second heat transfer layer 42 is pressed in the thickness direction (the third direction, i.e., the z direction) of the second heat transfer layer 42. The lower limit thickness of the second heat transfer layer 42 is defined in the same manner as the lower limit thickness of the heat transfer member 40.

The maximum recessed distance $L_1$ of the second attachment surface 15 from the first attachment surface 25 is smaller than the original thickness $t_1$ of the heat transfer member 40 when the heat transfer member 40 is not pressed, and is greater than the lower limit thickness $t_2$ of the heat transfer member 40 when the heat transfer member 40 is pressed in the thickness direction of the heat transfer member 40. In the present embodiment, the original thickness $t_1$ of the heat transfer member 40 is defined by the thickness $L_1$ of the second heat transfer layer 42. The lower limit thickness $t_2$ of the heat transfer member 40 is defined by the larger one of the lower limit thickness of the first heat transfer layer 41 and the lower limit thickness of the second heat transfer layer 42.

The first minimum thickness $t_3$ of the first heat transfer layer 41 is smaller than the second minimum thickness of the second heat transfer layer 42. The first maximum thickness of the first heat transfer layer 41 is equal to or less than the second maximum thickness of the second heat transfer layer 42. The surface 41a of the first heat transfer layer 41 may be flush with the surface 42a of the second heat transfer layer 42. It is acceptable that the surface 42a of the second heat transfer layer 42 protrudes from the first attachment surface 25 greater than the surface 41a of the first heat transfer layer 41 in the stacking direction of the conductive circuit pattern 12 and the insulating substrate 11 (the third direction, i.e., the z direction). It is also acceptable that the surface 41a of the first heat transfer layer 41 protrudes from the first attachment surface 25 greater than the surface 42a of the second heat transfer layer 42 in the stacking direction of the conductive circuit pattern 12 and the insulating substrate 11 (the third direction, i.e., the z direction).

Figure 12:
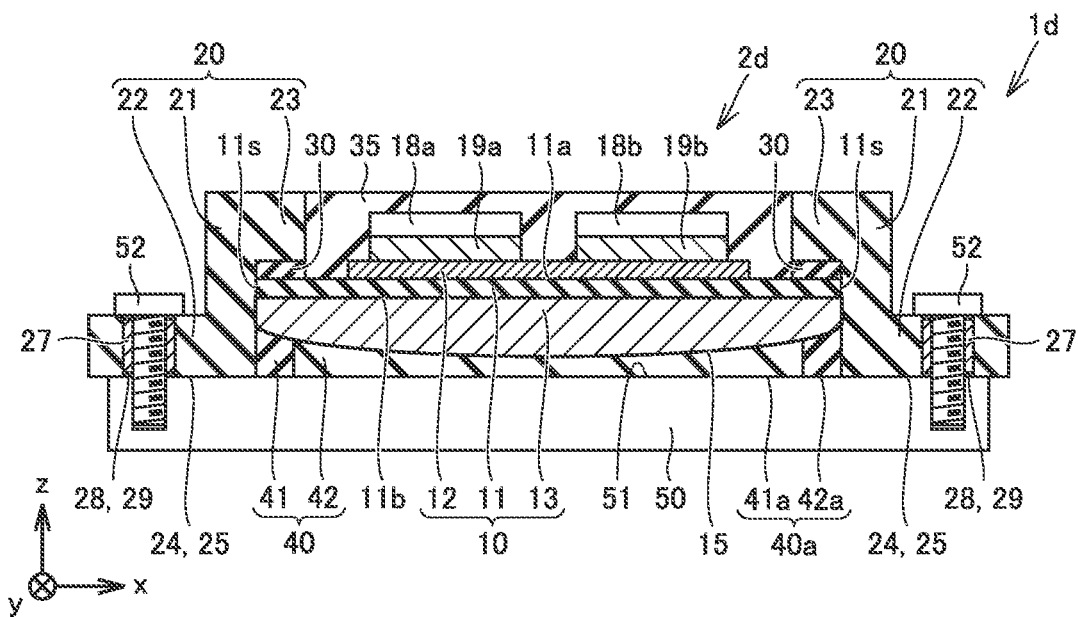
FIG. 12 is a schematic cross-sectional view of a power semiconductor module according to a modification of the fourth embodiment.

With reference to FIG. 12, the power semiconductor module 1d of the present embodiment may further include a heat sink 50. The heat sink 50 is attached to the first attachment surface 25, and is brought into contact with the heat transfer member 40. Specifically, the main surface 51 of the heat sink 50 is brought into contact with the surface 41a of the first heat transfer layer 41 and the surface 42a of the second heat transfer layer 42.

In addition to the effects of the power semiconductor module 1b of the second embodiment, the power semiconductor module 1d of the present embodiment has the following effects.

In the power semiconductor module 1d of the present embodiment, the heat transfer member 40 includes a first heat transfer layer 41 having fluidity and a second heat transfer layer 42 having non-fluidity.

When the temperature of the power semiconductor module 1d changes, the circuit board 10 may warp due to the difference in thermal expansion coefficient between the thermal expansion coefficient of the insulating substrate 11 and the thermal expansion coefficient of the conductive circuit pattern 12. The first heat transfer layer 41 having fluidity may alleviate the warpage of the circuit board 10, which prevents an excessive stress from being applied from the heat transfer member 40 to the insulating substrate 11. When attaching the heat sink 50 to the first attachment surface 25, the second heat transfer layer 42 having non-fluidity may increase the uniformity of the thickness of the first heat transfer layer 41 having fluidity. Whereby, when attaching the heat sink 50 to the first attachment surface 25, an excessive stress is prevented from being locally applied from the heat transfer member 40 to the insulating substrate 11, which makes it possible to prevent the insulating substrate 11 from being damaged.

In the power semiconductor module 1d of the present embodiment, the first minimum thickness $t_3$ of the first heat transfer layer 41 is smaller than the second minimum thickness (i.e., the thickness $t_4$) of the second heat transfer layer 42.

Therefore, the first heat transfer layer 41 may further alleviate the warpage of the circuit board 10. Thus, an excessive stress is prevented from being applied from the heat transfer member 40 to the insulating substrate 11, which makes it possible to prevent the insulating substrate 11 from being damaged.

In the power semiconductor module 1d of the present embodiment, the second heat transfer layer 42 surrounds the first heat transfer layer 41 in the plan view of the second attachment surface 15.

When attaching the heat sink 50 to the first attachment surface 25, the second heat transfer layer 42 having non-fluidity may further increase the uniformity of the thickness of the first heat transfer layer 41 having fluidity. When attaching the heat sink 50 to the first attachment surface 25, an excessive stress is prevented from being locally applied from the heat transfer member 40 to the insulating substrate 11, which makes it possible to prevent the insulating substrate 11 from being damaged. Further, even if the circuit board 10 is warped, it is possible to prevent the first heat transfer layer 41 having fluidity from leaking out of the outer edge of the circuit board 10 in the plan view of the second attachment surface 15.

Fifth Embodiment

Figure 13:
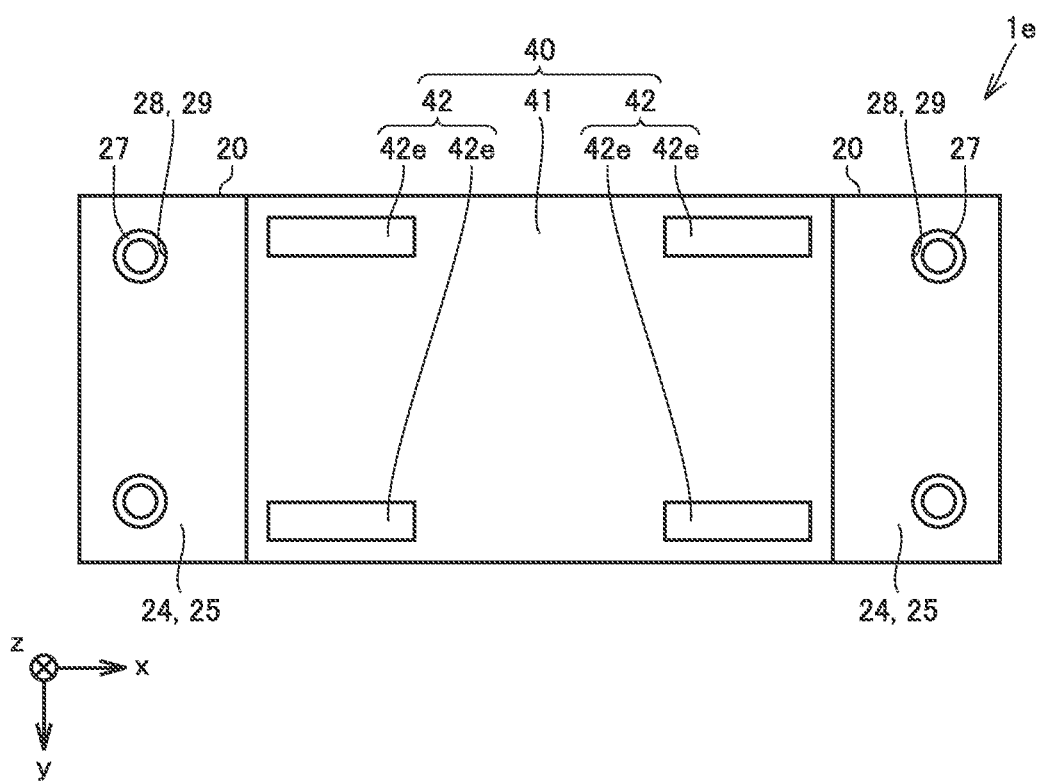
FIG. 13 is a schematic bottom view of a power semiconductor module according to a fifth embodiment.
Figure 14:
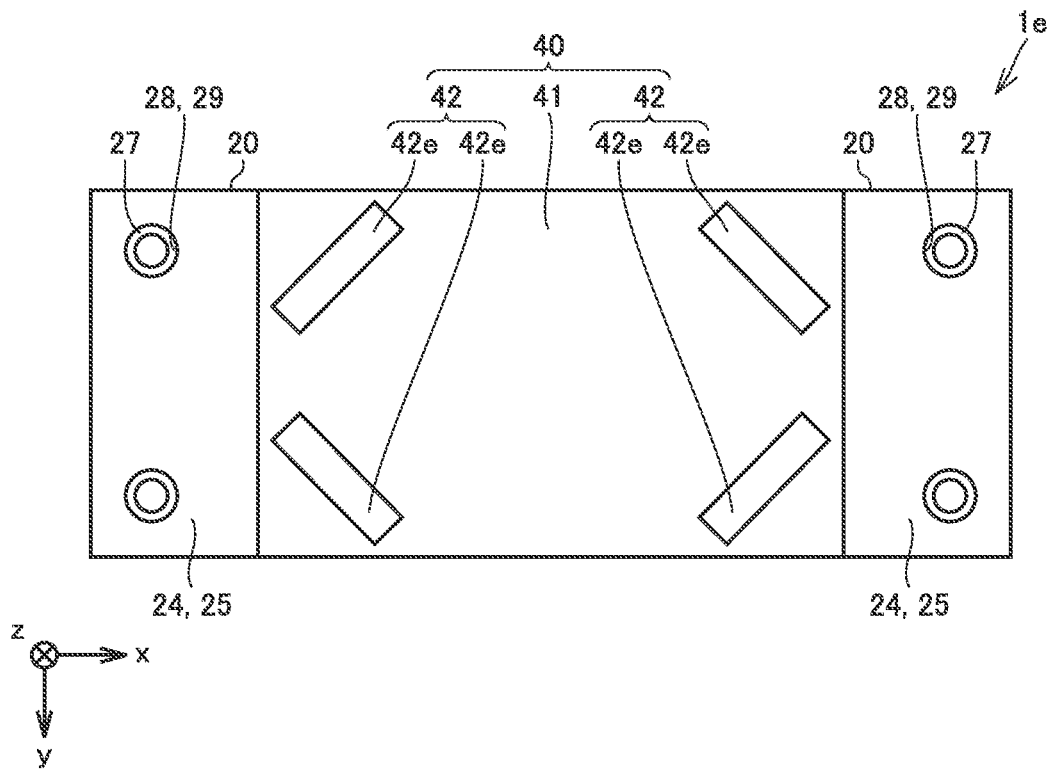
FIG. 14 is a schematic bottom view of a power semiconductor module according to a modification of the fifth embodiment.

A power semiconductor module 1e according to a fifth embodiment will be described with reference to FIGS. 13 and 14. The power semiconductor module 1e of the present embodiment mainly has the same configuration as the power semiconductor module 1d of the fourth embodiment, but is different from the power semiconductor module 1d of the fourth embodiment mainly in the following points.

In the power semiconductor module 1e, the second heat transfer layer 42 includes a plurality of heat transfer pieces 42e. The plurality of heat transfer pieces 42e are disposed at a plurality of corners of the second attachment surface 15. As illustrated in FIG. 13, the plurality of heat transfer pieces 42e may be disposed along the longitudinal direction (the first direction, i.e., the x direction) of the second attachment surface 15. As illustrated in FIG. 14, the plurality of heat transfer pieces 42e may be disposed diagonally with respect to the longitudinal direction and the lateral direction (the second direction, i.e., the y direction) of the second attachment surface 15. Each of the plurality of heat transfer pieces 42e may be disposed so as to intersect one of the two diagonal lines of the second attachment surface 15. The plurality of heat transfer pieces 42e may be disposed at least at two of the plurality of corners. Specifically, the plurality of heat transfer pieces 42e may be disposed at all of the plurality of corners.

Similar to the power semiconductor module 1d of the fourth embodiment, the power semiconductor module 1e of the present embodiment has the following effects.

In the power semiconductor module 1e of the present embodiment, the second heat transfer layer 42 includes a plurality of heat transfer pieces 42e.

Therefore, when attaching the heat sink 50 to the first attachment surface 25, the plurality of heat transfer pieces 42e may increase the uniformity of the thickness of the first heat transfer layer 41 having fluidity. When attaching the heat sink 50 to the first attachment surface 25, an excessive stress is prevented from being locally applied from the heat transfer member 40 to the insulating substrate 11, which makes it possible to prevent the insulating substrate 11 from being damaged.

In the power semiconductor module 1e of the present embodiment, the plurality of heat transfer pieces 42e are disposed at a plurality of corners of the second attachment surface 15.

When the temperature of the power semiconductor module 1e changes, the circuit board 10 may warp due to the difference in thermal expansion coefficient between the thermal expansion coefficient of the insulating substrate 11 and the thermal expansion coefficient of the conductive circuit pattern 12. The central portion of the circuit board 10 having the largest amount of warpage is in contact with the first heat transfer layer 41 having fluidity. Therefore, the warpage of the circuit board 10 may be alleviated by the first heat transfer layer 41 having fluidity. Thus, an excessive stress is prevented from being applied from the heat transfer member 40 to the insulating substrate 11, which makes it possible to prevent the insulating substrate 11 from being damaged. When attaching the heat sink 50 to the first attachment surface 25, the plurality of heat transfer pieces 42e may increase the uniformity of the thickness of the first heat transfer layer 41 having fluidity. When attaching the heat sink 50 to the first attachment surface 25, an excessive stress is prevented from being applied locally from the heat transfer member 40 to the insulating substrate 11, which makes it possible to prevent the insulating substrate 11 from being damaged.

Sixth Embodiment

Figure 15:
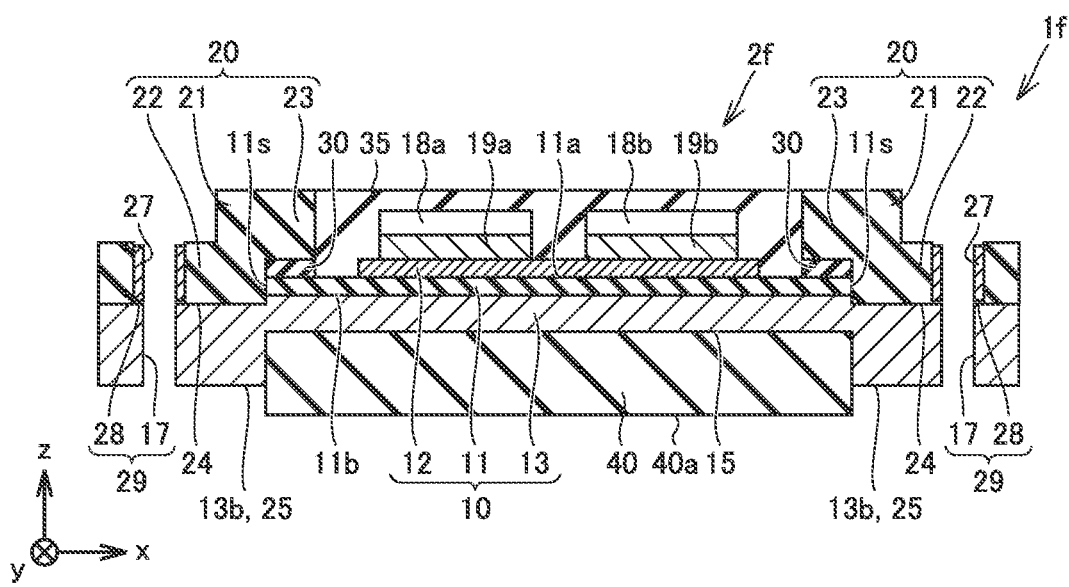
FIG. 15 is a schematic cross-sectional view of a power semiconductor module according to a sixth embodiment.

A power semiconductor module 1f and a power semiconductor assembly 2f according to a sixth embodiment will be described with reference to FIG. 15. The power semiconductor module 1f and the power semiconductor assembly 2f of the present embodiment mainly have the same configuration as the power semiconductor module 1 and the power semiconductor assembly 2 of the first embodiment, but are different from the power semiconductor module 1 and the power semiconductor assembly 2 of the first embodiment in the following points.

In the power semiconductor module 1f and the power semiconductor assembly 2f, the conductive plate 13 is brought into contact with not only the insulating substrate 11 but also the flange 22 of the case 20. Specifically, the conductive plate 13 is brought into contact with the back surface 24 of the case 20 (the flange 22). The conductive plate 13 includes a first attachment surface 25 and a second attachment surface 15. The first attachment surface 25 is flush with a back surface 13b of the conductive plate 13 opposite to a front surface of the conductive plate 13 that faces the back surface 24 of the case 20 (the flange 22). In the present embodiment, the back surface 13b of the conductive plate 13 is flush with the first attachment surface 25.

The conductive plate 13 is provided with a through hole 17 communicating with the through hole 28. The through hole 17 reaches the back surface 13b of the conductive plate 13. In the present embodiment, the hole 29 into which the fastening member 52 (see FIG. 16) is inserted is composed of the through hole 28 provided in the case 20 (the flange 22) and the through hole 17 provided in the conductive plate 13.

Figure 16:
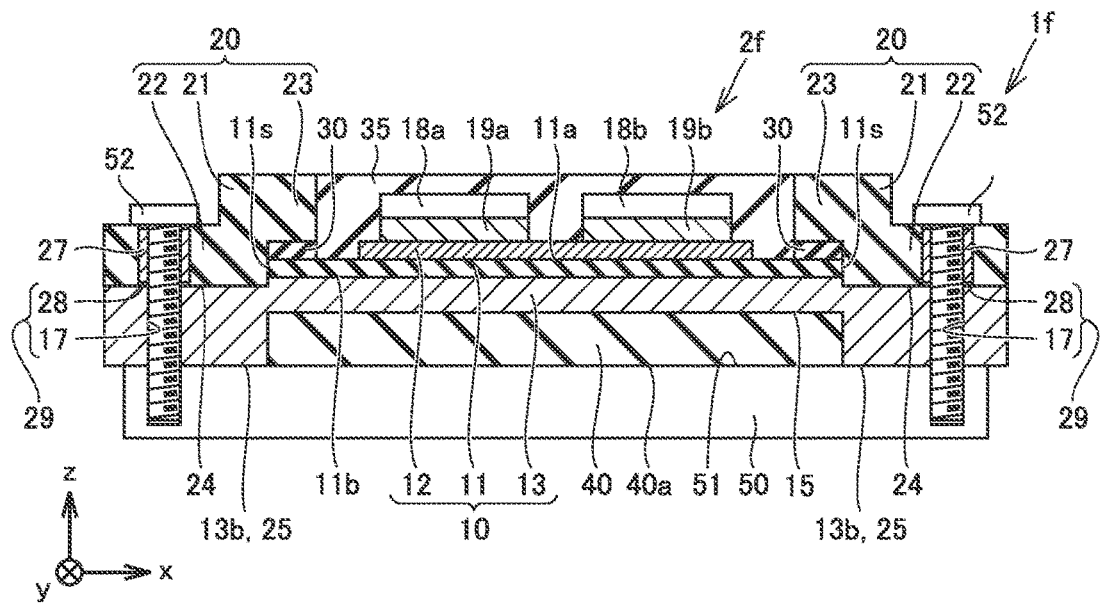
FIG. 16 is a schematic cross-sectional view of a power semiconductor module according to a modification of the sixth embodiment.

With reference to FIG. 16, the power semiconductor module 1f of the present embodiment may further include a heat sink 50. The heat sink 50 is attached to the first attachment surface 25, and is brought into contact with the heat transfer member 40. The main surface 51 of the heat sink 50 may be brought into contact with the back surface 13b of the conductive plate 13.

Similar to the power semiconductor module 1 of the first embodiment, the power semiconductor module 1f of the present embodiment has the following effects.

In the power semiconductor module 1f of the present embodiment, the insulating substrate 11 further includes a second main surface 11b opposite to the first main surface 11a. The circuit board 10 further includes a conductive plate 13 provided on the second main surface 11b of the insulating substrate 11. The conductive plate 13 includes a first attachment surface 25 and a second attachment surface 15.

Therefore, even if the heat transfer member 40 is compressed when attaching the heat sink 50 to the first attachment surface 25, an excessive stress is prevented from being applied from the heat transfer member 40 to the insulating substrate 11, which makes it possible to prevent the insulating substrate 11 from being damaged.

Seventh Embodiment

Figure 17:
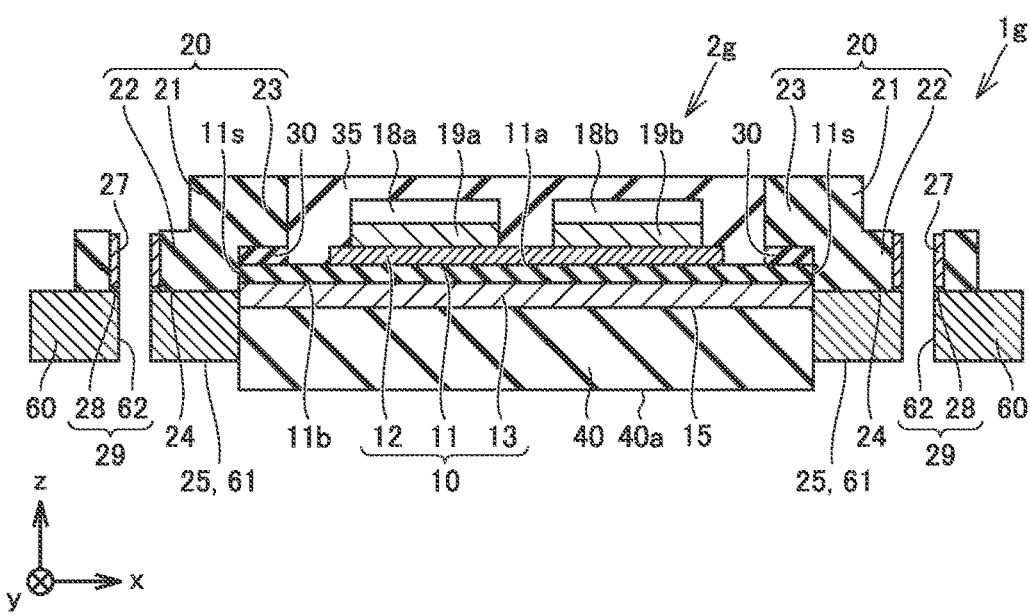
FIG. 17 is a schematic cross-sectional view of a power semiconductor module according to a seventh embodiment.

A power semiconductor module 1g and a power semiconductor assembly 2g according to a seventh embodiment will be described with reference to FIG. 17. The power semiconductor module 1g and the power semiconductor assembly 2g of the present embodiment mainly have the same configuration as the power semiconductor module 1 and the power semiconductor assembly 2 of the first embodiment, but are different from the power semiconductor module 1 and the power semiconductor assembly 2 of the first embodiment in the following points.

The power semiconductor assembly 2g further includes a spacer 60. The spacer 60 is made of a metal material such as copper or aluminum. The spacer 60 is provided on the back surface 24 of the case 20 (the flange 22). The first attachment surface 25 is flush with a back surface 61 of the spacer 60 distal from the back surface 24 of the case 20 (the flange 22) in the stacking direction (the third direction, i.e., the z direction) of the conductive circuit pattern 12 and the insulating substrate 11. In the present embodiment, the back surface 61 of the spacer 60 is flush with the first attachment surface 25. A through hole 62 communicating with the through hole 28 is provided in the spacer 60. The through hole 62 reaches the back surface 61 of the spacer 60. In the present embodiment, the hole 29 into which the fastening member 52 (see FIG. 18) is inserted is composed of the through hole 28 and the through hole 62.

Figure 18:
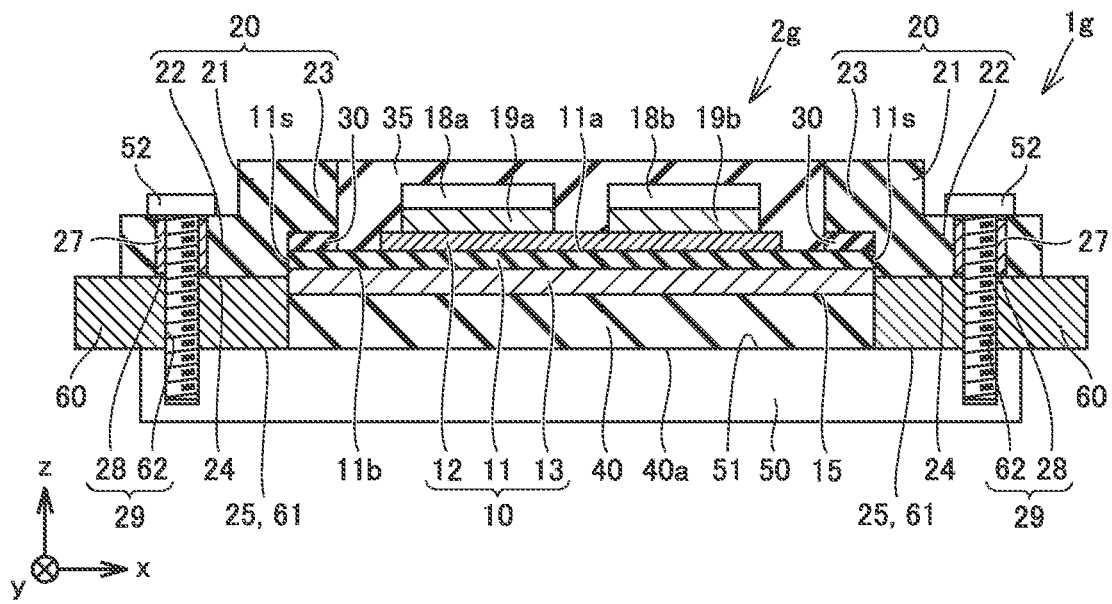
FIG. 18 is a schematic cross-sectional view of a power semiconductor module according to a modification of the seventh embodiment.

With reference to FIG. 18, the power semiconductor module 1g of the present embodiment may further include a heat sink 50. The heat sink 50 is attached to the first attachment surface 25, and is brought into contact with the heat transfer member 40. The main surface 51 of the heat sink 50 may be brought into contact with the back surface 61 of the spacer 60.

Similar to the power semiconductor module 1 of the first embodiment, the power semiconductor module 1g of the present embodiment has the following effects.

In the power semiconductor module 1g of the present embodiment, the power semiconductor assembly 2 further includes a spacer 60. The case 20 includes a first surface (back surface 24) distal from the insulating substrate 11 in the stacking direction (the third direction, i.e., the z direction) of the conductive circuit pattern 12 and the insulating substrate 11. The spacer 60 is provided on the first surface (the back surface 24). The second surface (the back surface 61) of the spacer 60 distal from the first surface in the stacking direction (the third direction, i.e., the z direction) of the conductive circuit pattern 12 and the insulating substrate 11 is flush with the first attachment surface 25.

Therefore, even if the heat transfer member 40 is compressed when attaching the heat sink 50 to the first attachment surface 25, an excessive stress is prevented from being applied from the heat transfer member 40 to the insulating substrate 11, which makes it possible to prevent the insulating substrate 11 from being damaged. The spacer 60 may increase the degree of freedom in designing the case 20.

Eighth Embodiment

In the present embodiment, the power semiconductor module 1, 1b, 1c, 1d, 1e, 1f and 1g according to any one of the first to seventh embodiments is applied to a power converter. Although a power converter 200 of the present embodiment is not particularly limited, it will be described as a three-phase inverter in the following.

Figure 19:
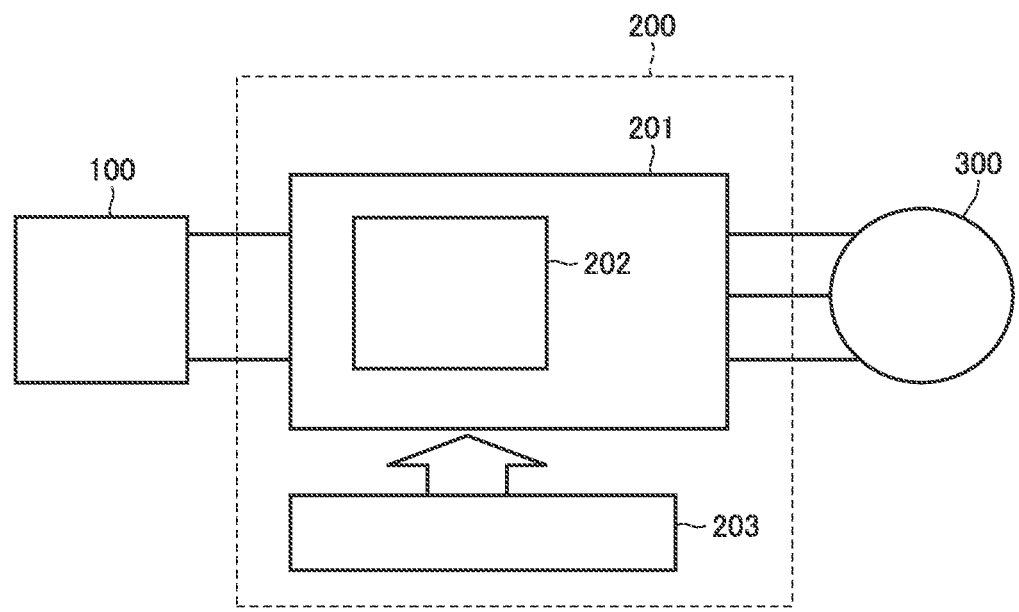
FIG. 19 is a block diagram illustrating a configuration of a power conversion system according to an eighth embodiment.

The power conversion system illustrated in FIG. 19 includes a power supply 100, a power converter 200, and a load 300. The power source 100 is a DC power source, and supplies DC power to the power converter 200. The power source 100 is not particularly limited, and it may be, for example, a DC system, a solar cell or a storage battery, or may be a rectifier circuit or an AC/DC converter connected to an AC system. The power supply 100 may be a DC/DC converter that converts DC power output from a DC system into another DC power.

The power converter 200 is a three-phase inverter connected between the power supply 100 and the load 300, and is configured to convert DC power supplied from the power supply 100 into AC power and supply the AC power to the load 300. As illustrated in FIG. 19, the power converter 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor driven by the AC power supplied from the power converter 200. The load 300 is not particularly limited, it may be an electric motor mounted on various electric apparatus such as an electric motor for a hybrid vehicle, an electric vehicle, a railroad vehicle, an elevator, or an air conditioner.

Hereinafter, the power converter 200 will be described in detail. The main conversion circuit 201 includes switching elements (not shown) and freewheel diodes (not shown). When the switching element switches the voltage supplied from the power supply 100, the main conversion circuit 201 converts DC power supplied from the power supply 100 into AC power and supplies the AC power to the load 300. The main conversion circuit 201 may have various circuit configurations. The main conversion circuit 201 according to the present embodiment is a two-level three-phase full bridge circuit, and may include six switching elements and six freewheel diodes connected in antiparallel to the switching elements, respectively. The power semiconductor module 1, 1b, 1c, 1d, 1e, 1f and 1g according to any one of the first to seventh embodiments described above may be applied to at least one of the switching elements and the freewheel diodes of the main conversion circuit 201. The power semiconductor module 1, 1b, 1c, 1d, 1e, 1f and 1g according to any one of the first to seventh embodiments may be applied as the power semiconductor module 202 constituting the main conversion circuit 201. Among the six switching elements, every two switching elements are connected in series so as to form upper and lower arms, and each of the upper and lower arms forms each phase (U phase, V phase and W phase) of the full bridge circuit. The output terminals of the upper and lower arms, in other words, the three output terminals of the main conversion circuit 201 are connected to the load 300.

The main conversion circuit 201 includes a driving circuit (not shown) for driving each switching element. The driving circuit may be provided inside the power semiconductor module 202 or may be provided outside the power semiconductor module 202. The driving circuit generates a driving signal for driving the switching elements included in the main conversion circuit 201, and supplies the driving signal to control electrodes of the switching elements of the main conversion circuit 201. Specifically, the driving circuit, in accordance with a control signal from the control circuit 203, outputs a driving signal for turning on the switching element and a driving signal for turning off the switching element the control electrode of each switching element.

In the power converter 200 according to the present embodiment, the power semiconductor module 1, 1b, 1c, 1d, 1e, 1f and 1g according to any one of the first to seventh embodiments is applied as the power semiconductor module 202 included in the main conversion circuit 201. Therefore, the reliability of the power converter 200 according to the present embodiment is improved.

In the present embodiment, as an example, it is described that the present disclosure is applied to a two-level three-phase inverter, but the present disclosure is not limited thereto, and the present disclosure may be applied to various power conversion devices. In the present embodiment, as an example, it is described that the power converter is a two-level power converter, it may be a three-level power converter or a multi-level power converter. When the power converter supplies power to a single-phase load, the present disclosure may be applied to a single-phase inverter. When the power converter supplies power to a DC load or the like, the present disclosure may be applied to a DC/DC converter or an AC/DC converter.

The power converter to which the present disclosure is applied is not limited to a power supply apparatus where the load is an electric motor, it may be incorporated in, for example, a power supply apparatus for an electric discharge machine or a laser machine, or a power supply apparatus for an induction cooker or a non-contact power supply system. The power converter to which the present disclosure is applied may be applied to a power conditioner for a photovoltaic power generation system, a power storage system, or the like.

It should be understood that the first to eighth embodiments disclosed herein are illustrative and non-restrictive in all respects. At least two of the first to eighth embodiments disclosed herein may be combined unless they are inconsistent to each other. For example, the heat transfer member of the fourth embodiment may be used as the heat transfer member of the power semiconductor module of the first embodiment, the third embodiment, and the fifth to seventh embodiments. The scope of the present disclosure is defined by the appended claims rather than by the above description, and the scope of the present disclosure is intended to include all modifications within the meaning and range equivalent to the appended claims.

What is claimed is:

1. A power semiconductor module comprising:
a power semiconductor assembly; and
a heat transfer member;
the power semiconductor assembly including:
- a circuit board that includes an insulating substrate having a first main surface and a conductive circuit pattern provided on the first main surface;
- a power semiconductor device mounted on the conductive circuit pattern; and
- a case that includes a hollow body and a protruding portion protruding from the hollow body toward the inside of the hollow body, the hollow body housing the power semiconductor device and the conductive circuit pattern,
the protruding portion being opposite to the first main surface or the conductive circuit pattern in a plan view of the first main surface, and directly or indirectly contacting the first main surface or the conductive circuit pattern,
the power semiconductor assembly including a first attachment surface to which a heat sink is attached,
the circuit board including a second attachment surface to which the heat transfer member is attached,
the first attachment surface and the second attachment surface being located on an opposite side to the power semiconductor device with respect to the insulating substrate,
the second attachment surface being recessed from the first attachment surface in a stacking direction of the conductive circuit pattern and the insulating substrate, and
a maximum recessed distance of the second attachment surface from the first attachment surface being smaller than an original thickness of the heat transfer member when the heat transfer member is not pressed, and being greater than a lower limit thickness of the heat transfer member when the heat transfer member is pressed in a thickness direction of the heat transfer member.

2. The power semiconductor module according to claim 1, wherein
the insulating substrate further includes a second main surface opposite to the first main surface, and a side surface connecting the first main surface and the second main surface,
the circuit board further includes a conductive plate provided on the second main surface,
the case includes the first attachment surface, and
the conductive plate includes the second attachment surface.

3. The power semiconductor module according to claim 2, wherein
the second attachment surface bulges toward a distal side from the insulating substrate in the stacking direction, and
a top portion of the second attachment surface is away from the protruding portion farther than the side surface in the plan view of the first attachment surface, and is recessed from the first attachment surface in the stacking direction.

4. The power semiconductor module according to claim 3, wherein
a recessed distance of the top portion of the second attachment surface from the first attachment surface is greater than the lower limit thickness of the heat transfer member when the heat transfer member is pressed.

5. The power semiconductor module according to claim 2, wherein
the second attachment surface bulges toward the opposite side to the insulating substrate in the stacking direction,
a top portion of the second attachment surface is away from the protruding portion farther than the side surface in a plan view of the first attachment surface, and protrudes above the first attachment surface in the stacking direction, and
a protruding height of the top portion of the second attachment surface from the first attachment surface is equal to or less than a difference between the original thickness of the heat transfer member and a sum of the maximum recessed distance and the lower limit thickness.

6. The power semiconductor module according to claim 1, wherein
the power semiconductor assembly further includes a spacer,
the case includes a first surface distal from the insulating substrate in the stacking direction,
the spacer is provided on the first surface, and
a second surface of the spacer distal from the first surface in the stacking direction is the first attachment surface.

7. The power semiconductor module according to claim 1, wherein
the insulating substrate further includes a second main surface opposite to the first main surface,
the circuit board further includes a conductive plate provided on the second main surface, and
the conductive plate includes the first attachment surface and the second attachment surface.

8. The power semiconductor module according to claim 1, wherein
the heat transfer member includes a first heat transfer layer having fluidity and a second heat transfer layer having non-fluidity.

9. The power semiconductor module according to claim 8, wherein
a first minimum thickness of the first heat transfer layer is smaller than a second minimum thickness of the second heat transfer layer.

10. The power semiconductor module according to claim 8, wherein
the second heat transfer layer surrounds the first heat transfer layer in a plan view of the second attachment surface.

11. The power semiconductor module according to claim 8, wherein
the second heat transfer layer includes a plurality of heat transfer pieces.

12. The power semiconductor module according to claim 11, wherein
the plurality of heat transfer pieces are disposed at a plurality of corners of the second attachment surface.

13. The power semiconductor module according to claim 1, wherein
the power semiconductor assembly includes the first attachment surface to which the heat sink is attached using a fastening member,
the power semiconductor assembly is provided with a hole which reaches the first attachment surface and into which the fastening member is inserted, and
at least a part of the hole is provided in the case.

14. The power semiconductor module according to claim 1 further comprises the heat sink, wherein
the heat sink is attached to the first attachment surface and is brought into contact with the heat transfer member.

15. The power semiconductor module according to claim 14, wherein
the heat sink is brought into contact with the first attachment surface.

16. A power converter comprising:
a main conversion circuit including the power semiconductor module according to claim 1, wherein the main conversion circuit converts an input power and output the converted power; and
a control circuit to output to the main conversion circuit a control signal for controlling the main conversion circuit.

* * * * *